United States Patent [19]

Ohsaki et al.

[11] Patent Number: 4,877,962

[45] Date of Patent: Oct. 31, 1989

[54] ION IMPLANTATION METHOD

[75] Inventors: Saburou Ohsaki; Taketo Takahashi; Toshihiro Miki, all of Itami, Japan

[73] Assignee: Mitsubishi Denki Kabushiki Kaisha, Japan

[21] Appl. No.: 188,485

[22] Filed: Apr. 29, 1988

[30] Foreign Application Priority Data

Apr. 30, 1987 [JP] Japan .................................. 62-109328

[51] Int. Cl.$^4$ ............................................... G21K 5/10
[52] U.S. Cl. ................................ 250/442.1; 250/492.2
[58] Field of Search ............. 250/492.2, 492.21, 440.1, 250/442.1

[56] References Cited

U.S. PATENT DOCUMENTS

| 3,911,282 | 10/1975 | Bergan | 250/492.21 |
| 3,993,909 | 11/1976 | Drews et al. | 250/442.1 |
| 4,405,864 | 9/1983 | del Rio | 250/492.21 |
| 4,733,087 | 3/1988 | Narita et al. | 250/442.1 |
| 4,733,091 | 3/1988 | Robinson et al. | 250/442.1 |
| 4,745,287 | 5/1988 | Turner | 250/442.1 |

FOREIGN PATENT DOCUMENTS 61-202426 9/1986 Japan .

OTHER PUBLICATIONS

Turner et al., "Recent Ion-Implantation Apparatus Using Surface Channeling Effect", Solid State Technology, May 1985, pp. 75-86.
Ohsaki et al., "Oblique-Rotate Ion Implantation Technique and Its Application to VLSI Devices", pp. 97-102.
"A Three-Axis Goniometer for Channeling Experiments", Knox, *Nu. Ins. and Methods*, No. 1, 1970, pp. 202-204.

*Primary Examiner*—Bruce C. Anderson
*Attorney, Agent, or Firm*—Leydig, Voit & Mayer

[57] ABSTRACT

An ion implantation method for a substrate of (100) silicon is disclosed in which the implantation is performed on a substrate which is tilted with respect to an incident ion beam and is rotated in its own plane by 15° to 75° from a position in which the (110) crystal planes of the silicon would be aligned with the incident ion beam. The substrate is then rotated in its own plane by 90°, 180°, and 270° from its initial position and ion implantation is performed at each position using the same dose of ions. The initial angle of rotation is preferably about 45°.

3 Claims, 2 Drawing Sheets

ION IMPLANTATION METHOD

BACKGROUND OF THE INVENTION

This invention relates to a method of performing ion implantation on a silicon substrate, and more particularly, it relates to an ion implantation method by means of which planar channeling in the substrate can be reduced.

Ion implantation is widely used in the manufacture of semiconductors in order to introduce impurities into silicon substrates on account of the superior reproducibility, uniformity, and controllability which can be achieved. FIG. 1 schematically illustrates a conventional electrostatic scanning ion implantation apparatus by means of which ion implantation is commonly carried out. As shown in this figure, ions are emitted from an ion source 1. Of these ions, undesired ones are removed by an analysis magnet 2. An ion beam 6 containing the desired dopant ions exits from the analysis magnet 2 and passes through Y-scan electrode plates 3 and X-scan elecrode plates 4, which control the direction of the ion beam 6. The ion beam 6 is directed at a silicon wafer 7 which is supported by a base 5. In order to reduce axial channeling of the dopant ions, the wafer 7 is usually tilted by an angle T so that the angle of incidence of the ion beam 6 with respect to a normal to the surface of the wafer 7 is about 7°.

FIG. 2 is a sheet resistance map of the surface of a silicon wafer 7 which was subjected to ion implantation by a conventional method using the apparatus of FIG. 1. Sheet resistance was determined by the four-probe method of resistivity measurement. The wafer 7 was made of (100) Si having a wafer flat 7a lying in a (110) crystal plane. The angle of tilt was 7°, and the angle of the wafer flat 7a with respect to the horizontal was 0°. Implantation of boron ions was performed at 50 keV at a dose of $2 \times 10^{13}$ atoms per square cm, after which annealing was performed at 900° C.

The two bold contour lines in FIG. 2 are reference values, and the other contour lines are drawn at intervals of 0.5% of the reference values. The (+) marks indicate regions where the sheet resistance was larger than the reference value, and the (−) marks indicate regions where the sheet resistance was smaller than the reference values.

As is clear from FIG. 2, there is a belt-shaped region of low sheet resistance at the center of the wafer 7, and the sheet resistance increases towards the top and bottom of the wafer 7. The cause of this decreased sheet resistance is not an increased dose of dopants at the center of the wafer 7. Rather, it is due to planar channeling. Namely, even though axial channeling along the <100> crystal axes was prevented by tilting the substrate by 7° with respect to the ion beam 6, as the wafer flat 7a was parallel to the horizontal, planar channeling took place between the (110) crystal planes, and dopant ions penetrated deeper into the surface of the wafer 7 than desired, just as when axial channeling occurs. When using an electrostatic scanning ion implantation apparatus in which an ion beam is scanned in the X and Y directions, the ion beam can easily become aligned with the (110) crystal planes at the center of the wafer 7, so that in the center of the wafer 7, the depth of implantation increases and the sheet resistance decreases.

SUMMARY OF THE INVENTION

Accordingly, it is an object of the present invention to provide a method for ion implantation of silicon substrates which can prevent both axial and planar channeling, thereby increasing the uniformity of doping of the substrate.

In the present invention, a substrate of (100) silicon is tilted with respect to an incident ion beam to prevent axial channeling, and at the same time, the substrate is rotated in its own plane to a position such that the (110) crystal planes of the substrate are not aligned with the incident ion beam. Ion implantation is performed four times on a single substrate at four different angles of rotation which differ from each other by multiples of 90°, using one-fourth of the total desired dose of ions each time. As a result, the (110) crystal planes are never aligned with the ion beam, and planar channeling is prevented.

An ion implantation method in accordance with the present invention comprises:

positioning a substrate of (100) Si in a first position such that it is tilted with respect to an ion beam with which it is to be irradiated and such that it is rotated in its own plane by a rotational angle of 15° to 75° from a position in which the (110) crystal planes of the substrate would be aligned with the ion beam;

irradiating the substrate with the ion beam in the first position using a dose of ions equal to approximately ¼ of the total desired dose of ions to be implanted into the substrate;

rotating the substrate in its plane to a second position which is 90° removed from the first position and irradiating the substrate with the ion beam using the same dose as before, approximately equal to ¼ of the total dose;

rotating the substrate in its plane to a third position which is 180° removed from the first position and irradiating the substrate with the ion beam using the same dose, i.e., approximately equal to ¼ of the total dose; and rotating the substrate in its plane to a fourth position which is 270° removed from the first position and irradiating the substrate with the ion beam using the same dose, i.e., approximately equal to ¼ of the total dose.

The rotational angle of the substrate when in the first position is preferably about 45° from a position in which the (110) crystal planes would be aligned with the ion beam. The angle of tilt of the substrate is preferably about 7°.

In a preferred embodiment, the present invention is carried out using an electrostatic scanning ion implantation apparatus, but any type of ion implantation apparatus can be employed, provided that it is equipped with a base for supporting a substrate which is able to tilt the substrate with respect to an incident ion beam and is able to rotate the substrate in its own plane.

BRIEF DESCRIPTION OF THE DRAWINGS

In the drawings, the same reference numerals indicate the same or corresponding parts.

DESCRIPTION OF THE PREFERRED EMBODIMENT

Figure 1:
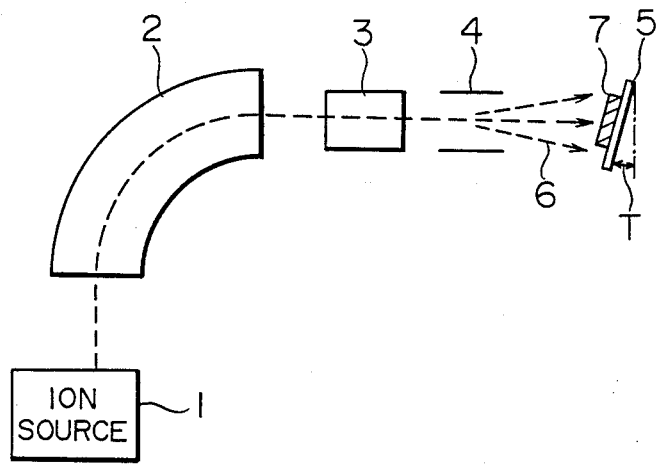
FIG. 1 is a schematic view of a conventional electrostatic scanning ion implantation apparatus.
Figure 3:
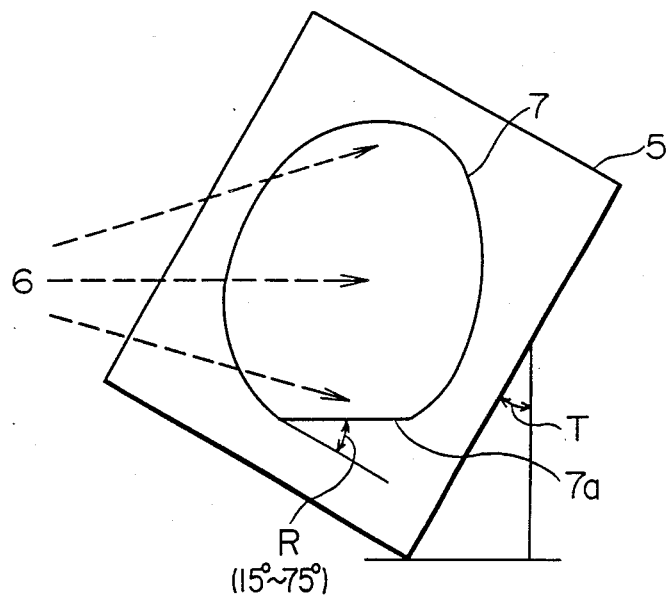
FIG. 3 is a schematic view of a silicon wafer during ion implantation illustrating the tilt angle T and the rotational angle R.
Figure 4:
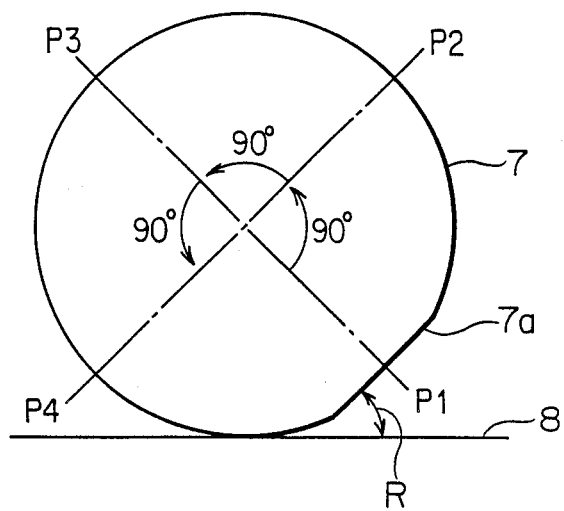
FIG. 4 is a front view of a silicon wafer during ion implantation in accordance with the method of the present invention.

Hereinbelow, an example of ion implantation performed in accordance with the method of the present invention will be described while referring to FIGS. 3 and 4 of the accompanying drawings. FIG. 3 is a schematic view of a silicon substrate in the form of a silicon wafer 7 which is mounted on a rotatable base 5 of an electrostatic scanning ion implantation apparatus like the one illustrated in FIG. 1. FIG. 4 is a front view of the wafer 7. The wafer 7 is made of (100) Si and has a flat 7a lying in a (110) crystal plane. The base 5 is able to tilt the wafer 7 with respect to incident ion beams 6, and it is able to rotate the wafer 7 in its own plane. The angle of tilt of the wafer 7 is indicated by T, and the angle of rotation of the wafer flat 7a with respect to a horizontal plane 8 is indicated by R. In this example, the direction of the ion beam 6 is such that when the wafer flat 7a is horizontal, the (110) crystal planes of the wafer 7 are aligned with the ion beam 6, and therefore the angle of rotation R is measured with respect to the horizontal plane 8.

In order to perform ion implantation in accordance with the present invention, the base 5 is tilted by a tilt angle T of about 7° and is rotated with respect to the horizontal plane 8 by a rotational angle R of 15° to 75°. Most preferably, the angle of rotation R is about 45°. When the wafer 7 is secured in this first position, indicated by P1, the wafer 7 is irradiated with a dose of ions equal to approximately ¼ of the total dose with which it is to be irradiated. In this position, the (110) crystal planes of the wafer 7 are not aligned with the ion beam 6, so planar channeling is largely prevented.

After performing ion implantation in this first position, the wafer 7 is then rotated by the base 5 in the plane of the wafer 7 by 90° in the counterclockwise direction in FIG. 4 to a second position P2. At this second position, the wafer 7 is again irradiated with approximately ¼ of the total dose of ions. Next, the wafer 7 is again rotated counterclockwise by 90° in its own plane to a third position P3 and irradiated with approximately ¼ of the total dose, after which it is rotated counterclockwise by 90° to a fourth position P4 and irradiated with the remaining approximately ¼ of the total dose. After irradiation at the fourth position, the total dose of ions has been implanted, and ion implantation of the wafer 7 is complete.

Figure 2:
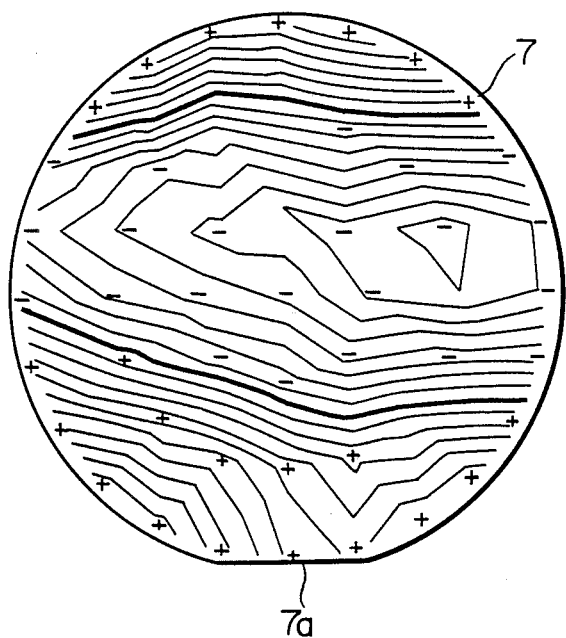
FIG. 2 is a sheet resistance map of a silicon wafer after ion implantation with a tilt angle of 7° and a rotational angle of 0°.

The (100) crystal plane of silicon has four-fold symmetry, so a wafer 7 having a flat 7a lying in a (110) crystal plane has <110> crystal axes which are parallel to and perpendicular to the flat 7a. If the angle between the flat 7a and a horizontal plane 8 is 0° for such a wafer 7, during ion implantation, planar channeling occurs along the (110) planes, as was the case with the wafer 7 of FIG. 2.

However, in the method of the present invention, as a wafer 7 is rotated in its own plane by an intitial angle of 15° to 75° away from a position in which the (110) crystal planes would be aligned with an incident ion beam, the (110) crystal planes are no longer aligned with an incident ion beam and little planar channeling takes place. Furthermore, as the wafer is rotated by 90° at a time to four different positions and ion implantation is performed with the same dose of ions at each position, planar channeling is yet further decreased. Therefore, the uniformity of the depth of implantation of ions in the surface of a wafer is greatly increased.

In the above-described example, the initial angle of rotation R of the wafer 7 was 15°-75°, but as the wafer 7 is rotated four times by 90° at a time to four different positions, the same effects can be obtained if the initial angle of rotation is (R+90°), (R+180°), or (R+270°).

What is claimed is:

1. An ion implantation method comprising:
    positioning a generally planar silicon substrate having a (100) orientation in a first position in which said substrate is tilted with respect to an incident ion beam and said substrate is rotated in its own plane by an angle of 15° to 75° to a first position from a position in which the (110) crystal planes of said substrate are aligned with said ion beam;
    irradiating said substrate in said first position with the ion beam with a dose of ions equal to approximately ¼ of the total desired dose of ions to be implanted into said substrate;
    rotating said substrate in its plane to a second position which is 90° removed from the first position and irradiating said substrate with said ion beam with a dose of ions equal to approximately ¼ of the total desired dose of ions;
    rotating said substrate in its plane to a third position which is 180° removed from the first position and irradiating said substrate with said ion beam with a dose of ions equal to approximately ¼ of the total desired dose of ions; and
    rotating said substrate in its plane to a fourth position which is 270° removed from the first position and irradiating said substrate with said ion beam with a dose of ions equal to approximately ¼ of the total desired dose of ions.

2. An ion implantation method as claimed in claim 1 wherein said angle of said first position is about 45°.

3. An ion implantation method as claimed in claim 1 wherein said substrate is tilted with respect to said ion beam by about 7°.

* * * * *